United States Patent [19]
Murray et al.

[11] Patent Number: 5,522,945
[45] Date of Patent: Jun. 4, 1996

[54] METHOD FOR FORMING TRINIOBIUM TIN SUPERCONDUCTOR WITH BISMUTH

[75] Inventors: Melissa L. Murray, Schaghticoke; Mark G. Benz, Burnt Hills; Bruce A. Knudsen, Amsterdam, all of N.Y.

[73] Assignee: General Electric Company, Schenectady, N.Y.

[21] Appl. No.: 272,973

[22] Filed: Jul. 1, 1994

[51] Int. Cl.$^6$ .............................. C23F 17/00; C22C 27/02
[52] U.S. Cl. .............................. 148/96; 420/901; 420/425; 420/426; 427/433; 505/806
[58] Field of Search .................................. 420/901, 425, 420/426; 148/96; 427/433; 505/806

[56] References Cited

U.S. PATENT DOCUMENTS

| | | | |
|---|---|---|---|
| 3,244,490 | 4/1966 | Saur | 420/901 |
| 3,484,208 | 12/1969 | Enstrom et al. | 420/901 |
| 3,887,364 | 6/1975 | Kawabe et al. | 420/901 |
| 4,224,087 | 9/1980 | Tachikawa et al. | 420/901 |
| 4,323,402 | 4/1982 | Tachikawa et al. | 148/133 |
| 5,362,331 | 11/1994 | Tada et al. | 148/96 |

FOREIGN PATENT DOCUMENTS

| | | | |
|---|---|---|---|
| 1199060 | 9/1986 | Japan. | |
| 1254542 | 11/1971 | United Kingdom | C23C 1/10 |
| 1342726 | 1/1974 | United Kingdom | C23B 9/00 |

OTHER PUBLICATIONS

Article—Enhancement of the Critical Current Density in Niobium–Tin, J. S. Caslaw—Cryogenics, Feb. 1971—pp. 57–59.
Zwicker et al Z. Metallkde 66 (1975) 738.
Scanlan et al Jour. Appl. Phys. 46 (1975) 2244.
Sharma et al J. Phys. C: Solid State Phys. 8 (1975) L–129.

*Primary Examiner*—David A. Simmons
*Assistant Examiner*—Margery S. Phipps
*Attorney, Agent, or Firm*—Noreen C. Johnson; James Magee, Jr.

[57] ABSTRACT

A method for making triniobium tin superconductor with improved critical current density is disclosed where an annealed niobium-base substrate is passed through a tin alloy bath containing tin, copper, and bismuth, to coat the substrate with tin and then annealing the coated substrate to form triniobium tin superconductor. A tin alloy bath containing up to twenty weight percent copper and up to one weight percent bismuth is disclosed.

2 Claims, No Drawings

5,522,945

METHOD FOR FORMING TRINIOBIUM TIN SUPERCONDUCTOR WITH BISMUTH

FIELD OF THE INVENTION

This invention relates to a method for producing a triniobium tin superconductor and the tin alloy bath used in the method. In particular, the process for forming triniobium tin superconductor utilizes bismuth in the molten tin alloy bath to increase the critical current density of the triniobium tin superconductor.

BACKGROUND OF THE INVENTION

The intermetallic compound triniobium tin, $Nb_3Sn$, is a type-II metallic superconductor of interest because it has high values of superconducting critical current density in high magnetic fields. Critical current density, $J_c$, is a value resulting from division of the critical current measured in a magnetic field by the cross-sectional area of the superconductor.

In type-II superconductors, the critical current density $J_c$ is controlled by microstructural heterogeneities which pin the fluxoid lattice, with strong pinning leading to high transport currents. In triniobium tin, it has been suggested that grain boundaries are the primary flux-pinning centers, and thus the control of grain size is essential to the superconducting properties of this material. A relation is known to exist between the superconductor grain size and critical current density: finer grain sizes lead to higher critical current densities.

Historically, triniobium tin has been formed by a number of different processes. These include: condensation from the vapor phase; crystallization from the liquid phase; diffusion between one solid phase and one liquid phase; and diffusion between two solid phases. The solid-liquid diffusion method for making triniobium tin superconductor comprises passing a niobium-based substrate through a bath of molten tin or tin alloy and then heat-treating it to form a layer of triniobium tin on the surface. However, the critical current density of triniobium tin produced by the aforesaid conventional method abruptly decreases in a high magnetic field.

In recent years, superconducting wires made of triniobium tin for large size magnets have been required to possess a higher critical current within a strong magnetic field. To obtain a magnet capable of generating a high magnetic field, it is necessary to use superconducting wires having both a high upper critical magnetic field and a high critical current density.

Efforts have been made to improve the critical current density of superconducting triniobium tin wire by ternary or quaternary additions to the bronze matrix or to the niobium core wires. Caslaw, British Patent No. 1,342,726, found that up to forty-five percent copper in the tin bath improved the critical current density and the reaction kinetics during the formation of triniobium tin tape. Other improvements in critical current density of triniobium tin have been found by adding gallium, indium, silver, and aluminum to the tin bath, and adding hafnium and titanium to the niobium core. This is the subject of Tachikawa U.S. Pat. No. 4,323,402.

There is a need to provide a triniobium tin superconductor which has a high critical current density and gives a magnet capable of generating a strong magnetic field.

There is also a need for a process that produces triniobium tin superconductors with high critical current density.

SUMMARY OF THE INVENTION

This invention fulfills these needs by providing a method to form triniobium tin superconductor which comprises the steps of passing an annealed niobium-base substrate through a molten tin alloy bath consisting essentially of tin, copper, and bismuth, at a rate sufficient to coat the substrate with about 2–30 micrometers of tin at a temperature between about 500°–1100° C. and then annealing the tin coated substrate at about 900°–1200° C. to form triniobium tin superconductor. The invention also provides a tin alloy bath for coating the substrate with tin.

An object of this invention is to improve the critical current density of triniobium tin superconductor by adding small amounts of bismuth to the tin alloy bath. Small amounts of bismuth mean up to about 1.0 weight percent bismuth of the total metals in the tin alloy bath. The copper in the bath can be up to about twenty weight percent copper with the remainder of the bath being substantially tin. In the present specification, the proportions of elements in the alloys are all expressed by weight percent.

A further object of this invention is to provide a method for forming the triniobium tin superconductor with increased critical current density.

Accordingly, it has been discovered that by adding small amounts of bismuth to the tin alloy bath, critical current testing at 4.2 K. and higher temperatures show increased critical current densities. Improvements in critical current density at high temperatures is of interest since a triniobium tin magnet may need to operate at temperatures around 10 K.

DESCRIPTION OF THE INVENTION

The novel feature of the present invention resides in the fact that a molten tin alloy consisting essentially of tin, copper, and bismuth is used to coat the surface of an annealed niobium-base substrate and subsequently to form triniobium tin superconductor having higher critical current densities. It has also been discovered that the reaction kinetics for the formation of the triniobium tin is increased due to the addition of small amounts of bismuth to the tin-copper alloy.

In the method of this invention, the tin alloy bath consists essentially of about 0.05–1.0 weight percent bismuth and about 0.1–20.0 weight percent copper, with the balance being substantially tin. The balance being substantially tin means that if the total alloying metals equal twenty weight percent copper and one weight percent bismuth, then the alloy balance comprises about seventy-nine weight percent tin.

The total amount of copper and bismuth to be included in the tin is not more than about twenty-one weight percent. The preferred amount is about ten weight percent copper and 0.1 weight percent bismuth. These amounts are preferred for improving the critical current density of the resulting triniobium tin superconductor.

An annealed niobium-base substrate can be an article of foil, tape, and wire, but is not limited to these articles. Any annealed niobium-base substrate that can be formed into triniobium tin superconductor is a suitable article for this invention. Additionally, in this invention, a foil is defined as having a thickness greater than about 0.0005 inches. The preferred thickness of the foil is about 0.0008–0.0012 inches. A tape is defined as having a thickness less than or equal to about 0.0005 inches. A wire for the purposes of this invention is a longitudinal body with a cylindrical shape having a circumference and a diameter.

The annealed niobium-base substrate is a niobium-zirconium-oxygen material where the zirconium and oxygen constitute a minor percentage of the material. Generally, the zirconium content can be up to about eight weight percent, the oxygen can be up to about 3.5 weight percent, and the balance being substantially niobium. The preferred substrate is niobium-one weight percent zirconium-0.4 weight percent oxygen.

It is advantageous have oxygen dissolved in the niobium-zirconium alloy. This can be accomplished by depositing an oxide layer on the niobium-zirconium surface, such as by anodizing. The oxide layer should be thick enough for sufficient oxygen to dissolve into the niobium-zirconium alloy. This is accomplished in an annealing step for about 10–30 seconds at a temperature above about 930° C. prior to the molten tin alloy bath. The product from annealing the oxide-coated niobium-zirconium is the annealed niobium-base substrate.

In the above anodizing step, a sufficient amount of oxygen means a stoichiometric amount of oxygen to form zirconium oxide in the niobium. For example, when using a niobium-one weight percent zirconium substrate, about 0.4 weight percent oxygen is desired. In atomic percent, the equivalent niobium-zirconium-oxygen substrate would be niobium-one atomic percent zirconium-2 atomic percent oxygen.

Generally, the process of making a triniobium tin superconductor consists of fabricating a niobium-base substrate composed of a solid solution of zirconium in niobium into a foil, tape, wire, or suitable article in a customary manner. The niobium-zirconium substrate is then anodized by methods known to those skilled in the art so that a layer of oxide forms on the substrate. The niobium-zirconium-oxygen substrate is annealed in a substantially oxygen free atmosphere at a temperature greater than about 930° C. for about 10–30 seconds. A substantially oxygen free atmosphere can have up to about twenty parts per million oxygen in an inert atmosphere, such as argon, helium, and mixtures thereof.

In accordance with this invention, the annealed substrate is then passed through a molten tin alloy bath, preferably heated at about 500°–1100° C., where said bath consists of a solid solution in tin of copper, up to about twenty weight percent, and bismuth, up to about one weight percent. The annealed niobium-base substrate is passed through the tin alloy bath at a rate sufficient to coat the substrate with enough tin to subsequently form the triniobium tin superconductor in a reaction anneal. The thickness of the tin coating should be about 2–30 micrometers. After the tin coating is applied to the substrate, a reaction anneal is performed at about 900°–1200° C. for a time sufficient to form triniobium tin superconductor.

The preferred temperature of the molten tin alloy bath is about 700°–1050° C.; the preferred tin alloy composition of the bath is about ten weight percent copper, about 0.1 weight percent bismuth, and the balance substantially tin. The preferred temperature and time for the reaction anneal are 1000°–1100° C. and about 50–500 seconds, respectively.

The triniobium tin superconductor in accordance with this invention is believed to contain small amounts of tin-copper-bismuth in the intergranular grain boundaries. The presence of these elements produces an effect on increasing the critical current density in a strong magnetic field of the triniobium tin superconductor.

The following examples and tables illustrate the present invention more specifically.

EXAMPLES

Liquid-diffusion processed triniobium tin super-conducting foil was used to study the effect of bismuth ternary additions to the tin alloy. In this method of forming triniobium tin superconductor, lengths of niobium alloy, Nb-1 at % Zr-2 at % O (Nb-1 wt % Zr-0.4 wt % O), foil (about 0.001 inch thick) were dipped in a tin-copper-bismuth alloy bath at about 1050° C. The bismuth: tin-copper weight ratio could be increased during the tin dipping process by adding appropriate amounts of bismuth to the molten alloy. The bismuth content of the tin alloy was varied in this manner from 0.0 to about 0.5 wt % bismuth. The tin-coated Nb-Zr-O foil was then annealed at 1050° C. for 200 seconds to form the triniobium tin reaction layers on each side of the niobium alloy foil. The critical current of the foil samples which contained varying amounts of bismuth was measured over a range of magnetic fields (1 telsa–8 telsa) and temperatures (4.2 K.–10 K.). The results are shown in Tables I–III.

Table I shows the critical current density as a function of magnetic field at a temperature of 10 K. The improvement in current density at lower magnetic fields (1 telsa) is as much as 19%.

TABLE I

Effect of Bismuth on the Critical Current Density at 10K

| Example | Magnetic Field (telsa) | $J_c$ ($\times 10^5$ A/cm$^2$) |
|---|---|---|
| | Baseline: Sn-10 wt % Cu | |
| 1 | 1 | 10.1 |
| 2 | 2 | 6.67 |
| 3 | 4 | 3.39 |
| 4 | 5 | 2.44 |
| 5 | 6 | 1.52 |
| 6 | 8 | 0.14 |
| | Sample: Sn-10 wt % Cu-0.1 wt % Bi | |
| 1 | 1 | 12.6 |
| 2 | 2 | 8.69 |
| 3 | 4 | 4.64 |
| 4 | 6 | 2.07 |
| 5 | 8 | 0.24 |
| | Sample: Sn-10 wt % Cu-0.2 wt % Bi | |
| 1 | 1 | 10.1 |
| 2 | 3 | 5.82 |
| 3 | 5 | 3.25 |
| 4 | 7 | 1.12 |
| | Sample: Sn-10 wt % Cu-0.05 wt % Bi | |
| 1 | 1 | 10.3 |
| 2 | 3 | 5.55 |
| 3 | 5 | 3.03 |
| 4 | 7 | 1.04 |

Besides increasing the critical current density, it was also discovered that the addition of small amounts of bismuth to the tin alloy bath increased the reaction kinetics of forming triniobium tin. This effect is demonstrated in Table II. The triniobium tin layer thickness is shown to increase by as much as nineteen percent with increasing amounts of bismuth (0.1 to 0.5 wt %).

TABLE II

Effect of Bismuth Concentration on Kinetics of Nb$_3$Sn Growth

| Example | wt % Bismuth in Sn-10 wt % Cu | reaction layer thickness (micrometers) |
|---|---|---|
| 1 | 0.0 | 6.39 |
| 2 | 0.01 | 6.81 |
| 3 | 0.05 | 6.76 |
| 4 | 0.1 | 7.00 |
| 5 | 0.2 | 7.44 |
| 6 | 0.5 | 7.60 |

Table III shows critical current density measurements for increasing amounts of bismuth in a tin-ten weight percent copper alloy. The measurements were made at 4.2 K., 5 telsa and at 10 K., 3 telsa.

TABLE III

| Effect of Bismuth Concentration on Critical Current Density | | | |
|---|---|---|---|
| Example | weight % Bi in Sn-10 wt % Cu | $J_c(\times 10^5$ A/cm$^2)$ 4.2K,5 telsa | $J_c(\times 10^5$ A/cm$^2)$ 10K,3 telsa |
| 1 | 0.0 | 11.6 | 5.69 |
| 2 | 0.05 | — | 5.55 |
| 3 | 0.1 | 11.8 | 6.43 |
| 4 | 0.2 | 10.6 | 3.25 |
| 5 | 0.5 | 9.3 | — |

What is claimed:

1. A method for forming triniobium tin superconductor comprising the steps of:

passing an annealed niobium-one weight percent zirconium-0.4 weight percent oxygen substrate through a molten tin-10 weight percent copper-0.1 weight percent bismuth bath at about 700°–1050° C. at a rate sufficient to coat the substrate with 2–30 micrometers of tin; and then annealing the tin coated substrate at about 1050° C. for about 200 seconds to form triniobium tin superconductor with tin-copper-bismuth present in the intergranular grain boundaries of the triniobium tin superconductor to increase the critical current density of the superconductor in the presence of a magnetic field at a temperature of 10 K. by at least about 25% with respect to a triniobium tin superconductor without bismuth.

2. A method according to claim 1 where the substrate is selected from the group consisting of a foil, a tape, and a wire.

* * * * *